United States Patent
Karmaniolas et al.

(10) Patent No.: US 6,553,644 B2
(45) Date of Patent: Apr. 29, 2003

(54) FIXTURE, CARRIER RING, AND METHOD FOR PROCESSING DELICATE WORKPIECES

(75) Inventors: Nick Karmaniolas, San Jose, CA (US); Wesley Hiroshi Tao, San Jose, CA (US); Li Zheng, Campbell, CA (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 09/781,009

(22) Filed: Feb. 9, 2001

(65) Prior Publication Data

US 2002/0108232 A1 Aug. 15, 2002

(51) Int. Cl.⁷ .............................. B23Q 7/00; B23Q 1/25
(52) U.S. Cl. ................. 29/559; 29/281.4; 29/603.17; 29/603.22; 269/37; 269/55; 269/58; 269/287; 269/289; 269/297; 269/317
(58) Field of Search .................. 29/559, 603.17, 29/603.19, 603.22, 281.4; 269/287, 289, 297, 317, 37, 55, 58, 71, 72, 73, 74

(56) References Cited

U.S. PATENT DOCUMENTS

| | | | | |
|---|---|---|---|---|
| 4,189,230 A | * | 2/1980 | Zasio ........................... 355/76 |
| 4,880,349 A | * | 11/1989 | Woodward ................... 29/743 |
| 4,924,258 A | * | 5/1990 | Tsutsui ....................... 355/53 |
| 4,948,330 A | * | 8/1990 | Nomura et al. .............. 414/749 |
| 4,998,712 A | * | 3/1991 | Park et al. .................... 269/25 |
| 5,280,894 A | * | 1/1994 | Witcraft et al. .............. 269/287 |
| 5,321,882 A | | 6/1994 | Zarouri et al. |
| 5,471,279 A | * | 11/1995 | Takizawa ..................... 355/73 |
| 5,509,554 A | | 4/1996 | Samuelson et al. |
| 5,513,594 A | * | 5/1996 | McClanahan et al. ...... 118/503 |
| 5,578,167 A | * | 11/1996 | Sooriakumar et al. ... 156/654.1 |
| 5,621,502 A | * | 4/1997 | Bronaugh et al. ............. 355/79 |
| 5,629,132 A | | 5/1997 | Suzuki et al. |
| 5,802,700 A | | 9/1998 | Chen et al. |
| 5,836,575 A | * | 11/1998 | Robinson et al. ........... 269/317 |
| 5,847,813 A | | 12/1998 | Hirayanagi |
| 6,001,532 A | | 12/1999 | Taylor et al. |
| 6,157,440 A | * | 12/2000 | Ikeda ........................... 355/75 |
| 6,164,636 A | * | 12/2000 | Taylor ......................... 269/287 |
| 6,231,038 B1 | * | 5/2001 | Keyser et al. .............. 269/287 |

FOREIGN PATENT DOCUMENTS

JP          03101622          11/1992

* cited by examiner

Primary Examiner—Gregory M. Vidovich
Assistant Examiner—Essama Omgba
(74) Attorney, Agent, or Firm—Robert B. Martin; Bracewell & Patterson, L.L.P.

(57) ABSTRACT

A device for processing workpieces utilizes a frame and a fixture. The frame has a perimeter with an opening, and inner and outer side walls. A pair of shelves are located in the opening for supporting a workpiece and a spring retains the workpiece on the frame. The fixture has work locations with elevators that are moved by an elevator handle. The fixture also has an engagement handle for actuating the springs. The workpieces may be simultaneously mounted to or removed from the frames with the fixture. The frames are loaded into the locations and both handles are rotated to raise the elevators and bend the springs. The workpieces are then placed on top of the elevators, and the elevator handle is rotated to lower the workpieces. Next, the engagement handle is rotated to release the springs to form assemblies that can be removed from the fixture.

16 Claims, 3 Drawing Sheets

FIXTURE, CARRIER RING, AND METHOD FOR PROCESSING DELICATE WORKPIECES

BACKGROUND OF THE INVENTION

1. Technical Field

The present invention relates in general to an improved apparatus and method for processing workpieces, and in particular to an improved fixture, carrier ring, and method for handling and processing delicate workpieces.

2. Description of the Prior Art

Generally, a data access and storage system consists of one or more storage devices that store data on magnetic or optical storage media. For example, a magnetic storage device is known as a direct access storage device (DASD) or a hard disk drive (HDD) and includes one or more disks and a disk controller to manage local operations concerning the disks. Disks are rigid platters that are usually made of aluminum alloy or a mixture of glass and ceramic, and are covered with a magnetic coating. Typically, two or three disks are stacked vertically on a common spindle that is turned by a disk drive motor at several thousand revolutions per minute (rpm).

The only other moving part within a typical HDD is the head stack assembly. Within most HDDs, one magnetic read/write head or slider is associated with each side of each platter and flies just above the platter's surface. Each read/write head is mounted on a suspension to form a head gimbal assembly (HGA). The HGA is then attached to a semi-rigid arm apparatus that supports the entire head flying unit. Several semi-rigid arms may be combined to form a single armature unit.

Each read/write head scans the surface of a disk during a "read" or "write" operation. The head and arm assembly is moved utilizing an actuator that is often a voice coil motor (VCM). The stator of a VCM is mounted to a base plate or casting on which the spindle is also mounted. The base casting is in turn mounted to a frame via a compliant suspension. When current is fed to the motor, the VCM develops force or torque that is substantially proportional to the applied current. The arm acceleration is therefore substantially proportional to the magnitude of the current. As the read/write head approaches a desired track, a reverse polarity signal is applied to the actuator, causing the signal to act as a brake, and ideally causing the read/write head to stop directly over the desired track.

Read/write heads or sliders are typically fabricated from a small substrate or workpiece. The workpieces are usually manually transported during some of the various steps required in the manufacturing process. Although operators attempt to handle the workpieces with great care, some damage to the very delicate workpieces is inevitable. The side edges and outer surfaces of the workpieces are particularly prone to be damaged. Although a number of techniques and methods have been proposed in the prior art to process workpieces during manufacturing, they do not overcome the problems cited above. Thus, an improved apparatus and method of processing such workpieces is needed.

SUMMARY OF THE INVENTION

One embodiment of an apparatus and method for processing workpieces utilizes a protective frame and a fixture. The frame has a rectangular perimeter and central opening, and inner and outer side walls. A pair of shelves are located in the opening for supporting a workpiece. A spring is mounted to the frame for retaining the workpiece on the frame. The fixture has a base with several work locations. Each location has an elevator that may be selectively moved via an elevator handle. The fixture also has an engagement handle for selectively actuating the springs of the frames.

The workpieces may be simultaneously mounted to or removed from the frames with the fixture. The frames are loaded into the locations and both handles are rotated to raise the elevators and bend the springs away from the frames. The workpieces are then placed on top of the elevators, and the elevator handle is rotated to lower the workpieces into the fixture. Next, the engagement handle is rotated to release the springs against the workpieces to form workpiece/frame assemblies. Finally, the elevator handle is rotated to lift the assemblies for removal from the fixture. The workpieces may be disassembled from the frames by reversing the previous steps.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

DETAILED DESCRIPTION OF THE PREFERRED EMBODIMENT OF THE PRESENT INVENTION

Figure 1:
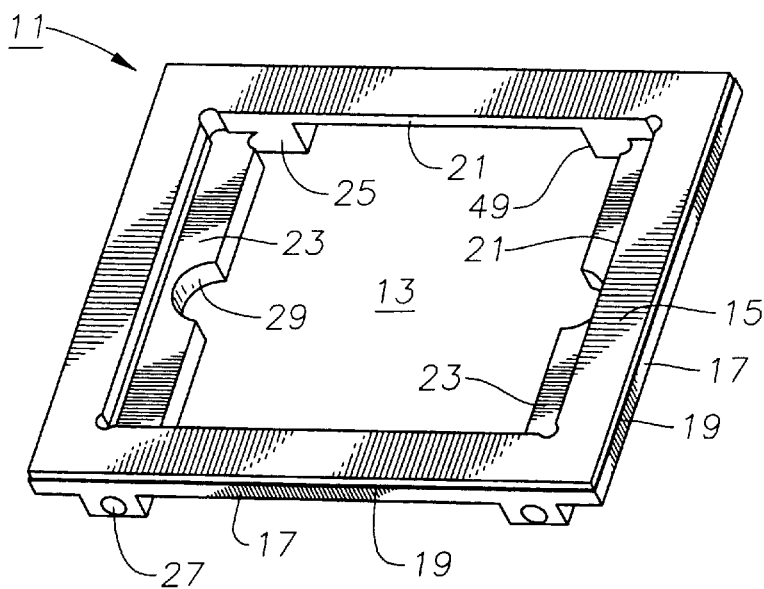
FIG. 1 is a top isometric view of one embodiment of a carrier ring constructed in accordance with the present invention.
Figure 2:
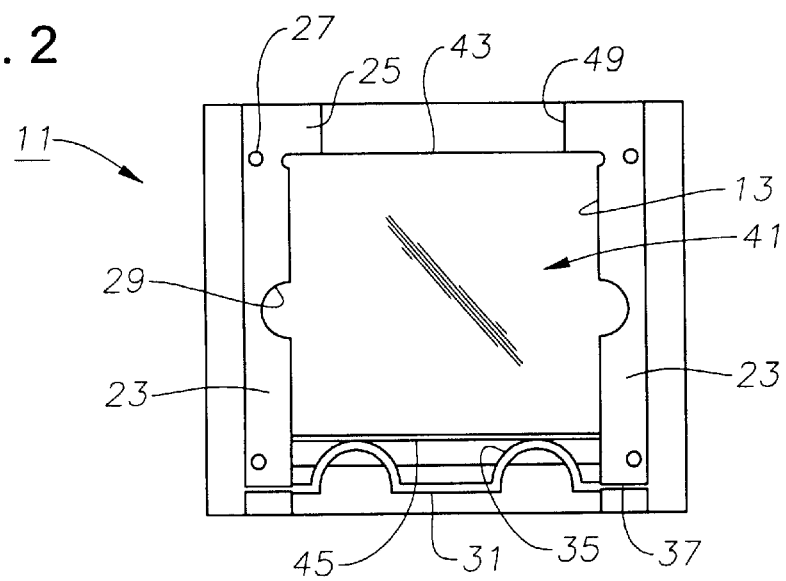
FIG. 2 is a bottom view of the carrier ring of FIG. 1 shown with the spring of FIG. 4.
Figure 3:
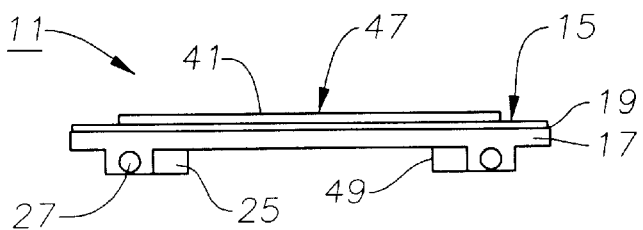
FIG. 3 is a side view of the carrier ring of FIG. 1.

The present invention comprises an apparatus and method of for processing delicate workpieces. The apparatus portion of the invention utilizes two mechanical components: a protective carrier ring or frame 11, and a fixture 51. Referring to FIGS. 1–3, frame 11 is shown constructed in accordance with the invention. Frame 11 has a generally rectangular body with a large central opening 13. In the preferred embodiment, the periphery or perimeter of frame 11 is primarily defined by a planar upper surface 15 having a width of approximately 6 mm. Orthogonal outer side walls 17 extend below upper surface 15 and contain a narrow groove or slit 19 that extends completely around the perimeter of frame 11. Frame 11 also has orthogonal inner side walls 21 that contain a pair of lower support structures or shelves 23. Shelves 23 have upper surfaces that are parallel to upper surface 15. In addition, frame 11 has several alignment features 25, 27, 29 that are used to assist an operator in positioning and aligning frame 11 in a fixture that will be described below.

Figure 4:
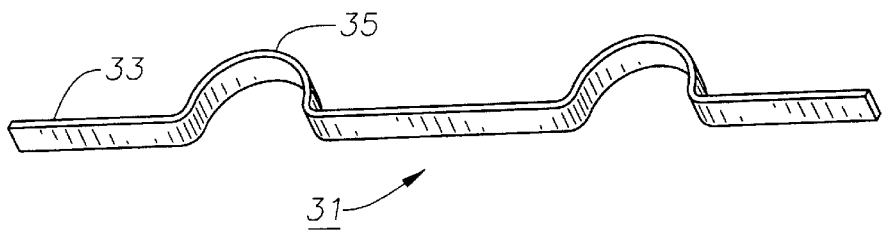
FIG. 4 is an isometric view of a spring used in conjunction with the carrier ring of FIG. 1.

As shown in FIGS. 2 and 4, a spring 31 is designed to be used in conjunction with frame 11. Spring 31 is an elongated member that is preferably formed from a flat metallic material such as spring steel. Spring 31 has two mounting ends 33 and a pair of spaced-apart, semi-circular contact portions 35 located between ends 33. In FIG. 2, ends 33 are shown fixedly mounted in a pair of opposite grooves 37 located in the bottom of frame 11. When spring 31 is properly installed in frame 11, contact portions 35 extend toward or into opening 13.

Also shown in FIG. 2 is a carrier or substrate 41 (hereinafter referred to as a "workpiece") that is removably mounted to frame 11 in accordance with the present invention. Workpiece 41 may comprise a number of objects, but the present invention is ideally suited for handling read/write head or slider substrates during photolithography processing. Part of the bottom of workpiece 41 abuts the upper surfaces of shelves 23. In addition, one side edge 43 of workpiece 41 abuts one inner side wall 21, and the opposite side edge 45 of workpiece 41 is releasably and flexibly engaged by contact portions 35 of spring 31. In the preferred embodiment (FIG. 3), the upper surface 47 of workpiece 41 is parallel to and elevated slightly above upper surface 15 of frame 11. Finally, frame 11 is also provided with a window 49 for viewing a serial number inscribed on side edge 43 of workpiece 41.

Figure 5:
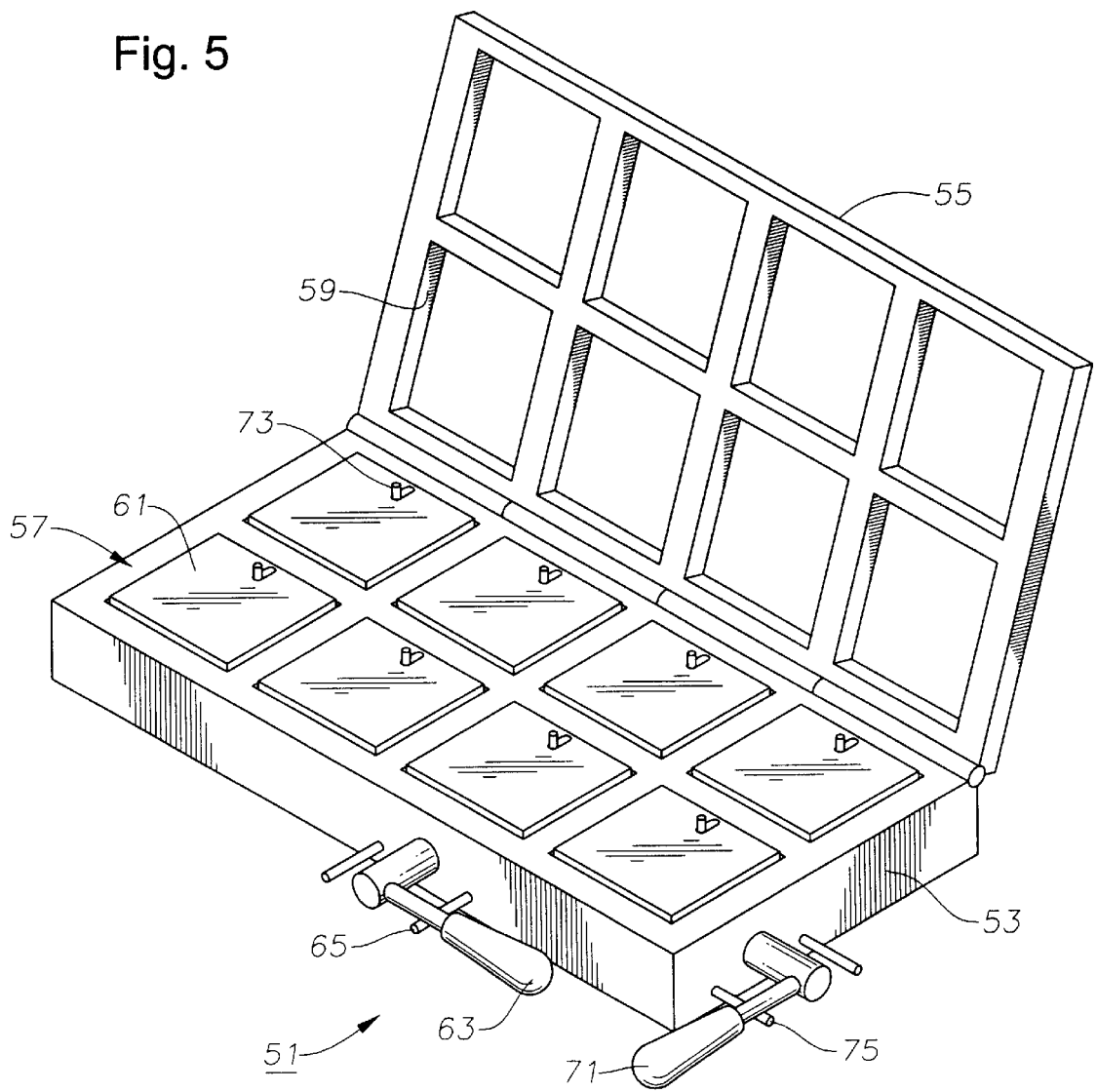
FIG. 5 is a top isometric view of one embodiment of a fixture constructed in accordance with the present invention and is shown with its cover in an open position.
Figure 6:
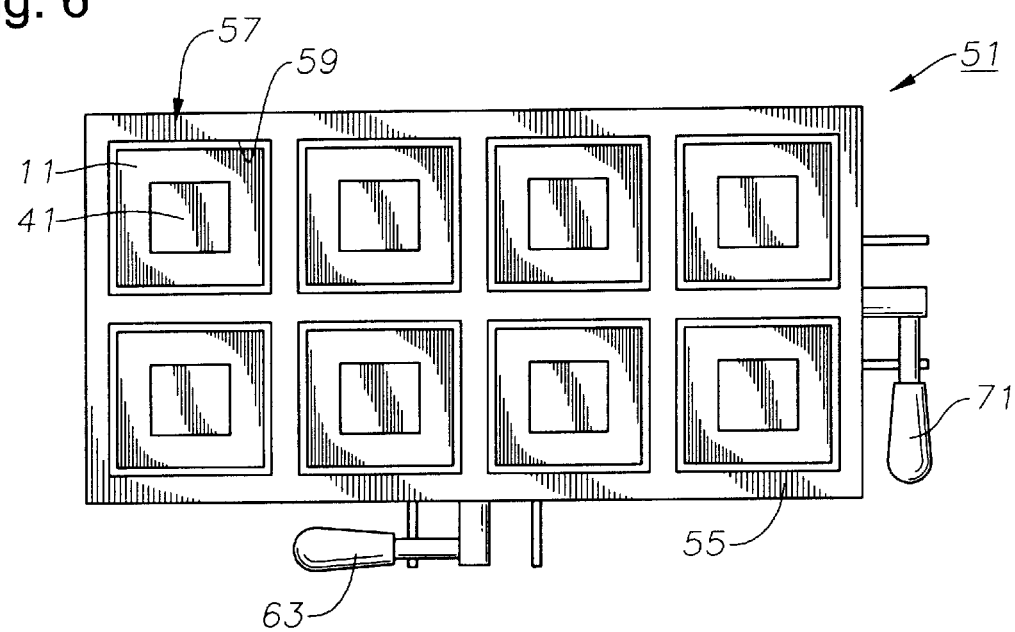
FIG. 6 is a top view of the fixture of FIG. 5 shown with its cover in a closed position during an initial stage of operation.
Figure 7:
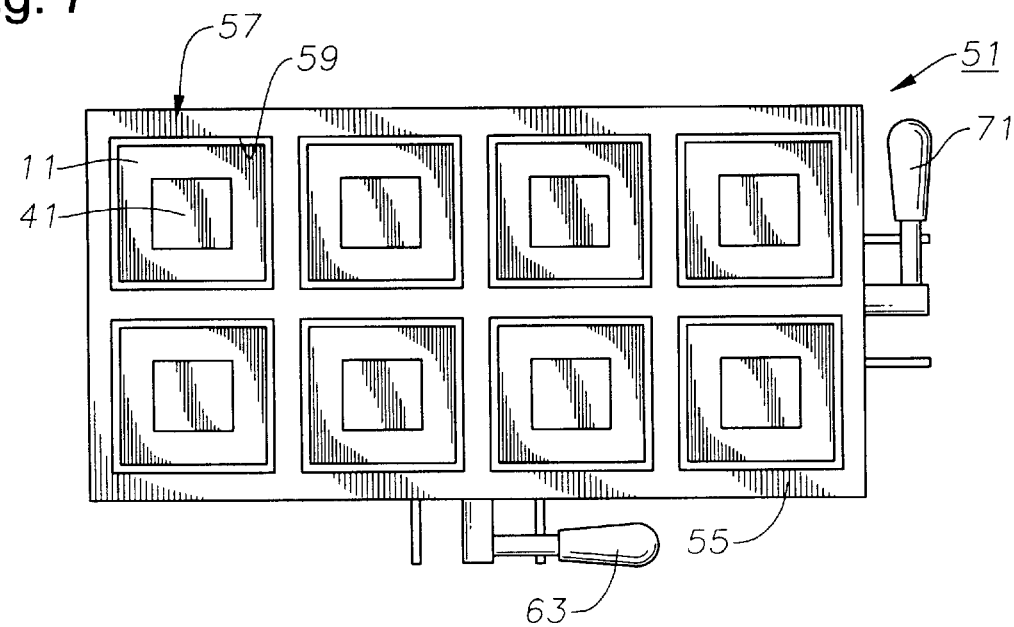
FIG. 7 is a top view of the fixture of FIG. 5 during an intermediate;stage of operation.

Referring now to FIGS. 5–7, the second component of the present invention, fixture 51, is shown. Fixture 51 has a generally rectangular base 53 with a hinged cover or lid 55 having a matching profile. In FIG. 5, lid 55 is shown in the open position. In the version illustrated, base 53 has eight work sites or locations 57, and lid 55 has eight openings 59 that align and register with locations 57 when lid 55 is in the closed position (FIGS. 6 and 7). Each location 57 has a platform or elevator 61 that may be selectively moved in the vertical direction relative to base 53 and lid 55 via an elevator lever or handle 63. When elevator handle 63 is rotated to a position two (FIGS. 5 and 7), elevators 61 are simultaneously lifted to an elevated position. However, when elevator handle 63 is rotated to a position one (FIG. 6), elevators 61 are simultaneously lowered to a lower position. The range of motion of elevator handle 63 is limited by a pair of stop pins 65.

Fixture 51 also has an engagement lever or handle 71 that is used to selectively mount workpieces 41 to respective ones of the frames 11. Again, each location 57 has an engagement member 73 that may be selectively moved in a generally horizontal direction relative to base 53 and lid 55 via engagement handle 71. When engagement handle 71 is rotated to a position one (FIGS. 5 and 6), engagement members 73 are simultaneously actuated to an engaged position. In the engaged position, engagement members 73 release springs 31 on frames 11, thereby allowing springs 31 to engage workpieces 41 such that workpieces 41 are mounted to frames 11. However, when engagement handle 71 is rotated to a position two (FIG. 7), engagement members 73 are simultaneously actuated to a disengaged position. In the disengaged position, engagement members 73 pull springs 41 away from workpieces 41 such that workpieces 41 are not mounted to frames 11. The range of motion of engagement handle 71 is limited by stop pins 75.

In operation, a plurality of workpieces 41 may be simultaneously mounted to or removed from an equal number of frames 11 via fixture 51. Before mounting workpieces 41 to frames 11, handles 63, 71 must be originally located in their respective positions one (FIG. 6), so that elevators 61 are in their lower positions and engagement members 73 are in their engaged positions. With lid 55 in the closed position, up to eight frames 11 (in the embodiment shown) are loaded into locations 57 such that their respective springs 31 face away from elevator handle 63 (e.g., adjacent to engagement members 73).

With frames, 11 in place, both handles 63, 71 are rotated to their respective positions two (FIG. 7). When handles 63, 71 are moved to positions two, engagement members 73 gently deflect and elastically bend springs 31 away from frames 11, and elevators 61 are raised to their elevated or exposed positions. Next, a workpiece 41 is carefully placed (preferably with a dove-tailed clamp) into each opening 59 occupied by a frame 11 such that workpieces 41 are "nested" in locations 57 on top of elevators 61. In the subsequent step, elevator handle 63 is rotated to position one to lower or withdraw workpieces 41 down into fixture 51. Next, engagement handle 71 is rotated to position one to release springs 31 such that contact portions 35 (FIG. 2) engage side edges 45 of workpieces 41. Workpieces 41 are now mounted to their respective frames 11. Finally, elevator handle 63 is rotated to position two to elevate the workpiece/frame assemblies for removal from fixture 51.

After a workpiece/frame assembly is removed from fixture 51, workpiece 41 and frame 11 may be processed together as if they were a single unit since spring 31 securely retains workpiece 41 on frame 11 while reducing the risk of damage to workpiece 41 during processing. For example, during the step of photolithography, the assembly may be processed as a unit, and any excess resist may be trimmed along slits 19 (FIG. 1) on frame 11. Note that prior to lamination, frame 11 should be ashed so that the resist will adhere to upper surface 15.

After processing, the workpiece/frame assemblies can be disassembled via the following steps. Prior to the disassembly sequence, elevator handle 63 should be in position two so that elevators 61 are in the elevated position. Engagement handle 71 should be in position one so that engagement members are in the released position. One assembly is placed in each location 57 so that it nests on an elevator 61. Next, elevator handle 63 is rotated to position one to lower the assemblies into fixture 51. Then engagement handle 71 is rotated to position two in order to disengage springs 31 from workpieces 41. Workpieces 41 are now detached from frames 11. In the final step, elevator handle 63 is rotated to position two to lift workpieces 41 out of fixture 51 for removal therefrom, preferably with a dove-tailed clamp.

The present invention has several advantages. When the delicate workpieces used to form sliders are manually transported during the various steps required in the manufacturing process, the present invention assists operators in handling the workpieces with great care, thereby reducing damage to the very delicate workpieces. In particular, the side edges and outer surfaces of the workpieces are protected to reduce the number of broken rails and chips on the row ends. In addition, the present invention has other features as well, including: an input/output fixture and carrier ring, a wide periphery on the carrier ring for improved handling, a spring to secure the workpiece in the carrier ring, a window to view the serial number on the workpiece, and a groove to cut off excess resist. These features combine to decrease the amount of rework required, rail etch defects yield loss, and handling, while eliminating the need for a die cutting process.

While the invention has been shown or described in only some of its forms, it should be apparent to those skilled in the art that it is not so limited, but is susceptible to various changes without departing from the scope of the invention.

What is claimed is:

1. An apparatus for handling a workpiece, comprising:
    a frame having a perimeter with an opening and a support structure located in the opening adapted to support the workpiece on the frame;
    retention means mounted to the frame for retaining the workpiece on the frame;
    a fixture adapted to assemble and disassemble the workpiece to the frame, the fixture having movement means for moving the frame relative to the fixture, and engagement means on the fixture for actuating the retention means on the frame such that the retention means is moved relative to the workpiece to engage and release the workpiece with respect to the frame.

2. The apparatus of claim 1 wherein the frame has a planar top surface, orthogonal inner and outer side walls, and wherein the support structure is shelves.

3. An apparatus for handling a workpiece, comprising:
    a frame having a perimeter with an opening and a support structure located in the opening adapted to support the workpiece on the frame;
    retention means mounted to the frame for retaining the workpiece on the frame;
    a fixture adapted to assemble and disassemble the workpiece to the frame, the fixture having movement means for moving the frame relative to the fixture, and engagement means for actuating the retention means relative to the frame and the workpiece; and wherein the frame has a slit extending around the perimeter for use during processing of the workpiece.

4. The apparatus of claim 1 wherein the retention means is a spring.

5. The apparatus of claim 4 wherein the spring is an elongated flat member having mounting ends and semi-circular contact portions therebetween.

6. The apparatus of claim 1 wherein the movement means comprises an elevator.

7. The apparatus of claim 1 wherein the engagement means deflects the retention means out of engagement with the workpiece and releases the retention means into engagement with the workpiece.

8. The apparatus of claim 1 wherein the movement means and the engagement means are independently actuated by separate, manually-controlled levers.

9. An apparatus for handling workpieces, comprising:
    a plurality of frames, each having a perimeter with an opening and a support structure located in the opening adapted to support one of the workpieces on the frame;
    a spring mounted to each of the frames for selectively retaining the workpieces on the frames; and
    a fixture adapted to simultaneously assemble and disassemble the workpieces to the frames, the fixture having elevation means for simultaneously moving the frames in a vertical direction relative to the fixture, and engagement means on the fixture for simultaneously deflecting the springs on the frames out of the openings such that the springs disengage the workpieces, and releasing the springs into the openings such that the springs engage the workpieces.

10. The apparatus of claim 9 wherein each of the frames has a planar top surface, orthogonal inner and outer side walls, and wherein the support structure is shelves.

11. The apparatus of claim 9 wherein each of the springs is an elongated flat member having mounting ends and semi-circular contact portions therebetween for contacting a respective one of the workpieces.

12. The apparatus of claim 9 wherein the elevation means and the engagement means are independently actuated by separate, manually-controlled levers.

13. A method of handling workpieces, comprising the steps of:
    (a) providing a fixture, a frame with a retainer, and a workpiece, the fixture having an elevator with first and second positions, and an actuator with first and second positions;
    (b) placing the frame in the fixture;
    (c) moving the actuator from the first position to the second position to retract the retainer, and moving the elevator from the first position to the second position to expose the frame;
    (d) placing the workpiece on the elevator;
    (e) moving the elevator from the second position to the first position to withdraw the frame and the workpiece, and moving the actuator from the second position to the first position to release the retainer and retain the workpiece on the frame; and
    (f) moving the elevator from the first position to the second position to expose the frame and the workpiece as an assembly.

14. The method of claim 13, further comprising the steps of disassembling the assembly by placing the assembly in the fixture, moving the elevator to the first position, moving the actuator to the first position, and then moving the elevator to the second position.

15. The method of claim 13 wherein the fixture has a plurality of locations for a plurality of the frames and the workpieces, and wherein steps (c) through (f) comprise simultaneously assembling a plurality of the assemblies.

16. The method of claim 15 further comprising the steps of simultaneously disassembling the assemblies by placing the assemblies in the fixture, moving the elevator to the first position, moving the actuator to the first position, and then moving the elevator to the second position.

* * * * *